(12) United States Patent  
Olivo

(10) Patent No.: US 8,456,201 B2
(45) Date of Patent: Jun. 4, 2013

(54) ENERGY-RECYCLING RESONANT DRIVE CIRCUITS FOR SEMICONDUCTOR DEVICES

(75) Inventor: Anthony J. Olivo, Raleigh, NC (US)

(73) Assignee: Eaton Corporation, Cleveland, OH (US)

(*) Notice: Subject to any disclaimer, the term of this patent is extended or adjusted under 35 U.S.C. 154(b) by 4 days.

(21) Appl. No.: 13/177,283

(22) Filed: Jul. 6, 2011

(65) Prior Publication Data

US 2013/0009672 A1 Jan. 10, 2013

(51) Int. Cl.
*H03B 1/00* (2006.01)
(52) U.S. Cl.
USPC ........... 327/110; 327/112; 327/111; 327/424; 327/460; 327/461
(58) Field of Classification Search
USPC ................ 327/108, 110, 111, 112, 423, 424, 327/428, 453, 460, 461, 494, 508, 587
See application file for complete search history.

(56) References Cited

U.S. PATENT DOCUMENTS

| 5,264,736 | A * | 11/1993 | Jacobson | 327/365 |
| 7,459,945 | B2 * | 12/2008 | Omura | 327/108 |
| 8,054,110 | B2 * | 11/2011 | Wang et al. | 327/109 |
| 2003/0062930 | A1 * | 4/2003 | Li et al. | 327/108 |

OTHER PUBLICATIONS

Chen, Yuhui. *Resonant Gate Drive Techniques for Power MOSFETs*. MS Thesis. Virginia Polytechnic Institute and State University, Blacksburg, Virginia, May 2000. Print.
Kong, Xiaoli et al., "Half Bridge Resonant Driver for High Frequency Application", Delta Power Electronics Center (2010).
Oughton, Jr. et al., "Resonant Tank Drive Circuits for Current-Controlled Semiconductors Devices", U.S. Appl. No. 12/968,861, filed Dec. 15, 2010; 13 pages.

* cited by examiner

*Primary Examiner* — Lincoln Donovan
*Assistant Examiner* — Jung H Kim
(74) *Attorney, Agent, or Firm* — Myers Bigel Sibley & Sajovec, P.A.

(57) ABSTRACT

A transistor driver includes an inductor coupled to a gate terminal of a transistor and a switching circuit coupled to the inductor and configured to charge a capacitance at a gate terminal of the transistor from a source via the inductor responsive to a first state of a control input, to block discharge of the charged capacitance responsive to a voltage at the gate terminal and to return charge from the charged capacitance to the source responsive to transition of the control input to a second state. The switching circuit may include a switch coupled in series with the inductor and the source and configured to conduct responsive to transition of the control input to the first state and a rectifier coupled in series with the inductor and the source and configured to block discharge of the charged capacitance responsive to the voltage at the gate terminal.

19 Claims, 5 Drawing Sheets

ENERGY-RECYCLING RESONANT DRIVE CIRCUITS FOR SEMICONDUCTOR DEVICES

BACKGROUND

The inventive subject matter relates to drive circuits for semiconductor devices and, more particularly, to resonant drive circuits.

Semiconductor switching devices, such as MOSFETs and IGBTs, are commonly used in power supply devices, such as switchmode power supplies, uninterruptible power supplies (UPSs), motor drives and the like. At certain power levels and switching frequencies, the power dissipated by such switching devices may represent a large portion of overall system losses, especially under light loading conditions.

There are a variety of different techniques used to drive MOSFETs, IGBTs and similar devices. Among these are techniques that use resonant circuits. Examples of resonant drive circuits are described, for example, in "Half Bridge Resonant Driver for High Frequency Application," by Delta Power Electronics Center (2010), "Resonant Gate Drive Techniques for Power MOSFETs," CPES (May 2000) and U.S. patent application Ser. No. 12/968,861, entitled "Resonant Tank Drive Circuits for Current-Controlled Semiconductor Devices," filed Dec. 15, 2010.

SUMMARY OF THE INVENTIVE SUBJECT MATTER

Some embodiments of the inventive subject matter provide a transistor driver including an inductor coupled to a gate terminal of the transistor and a switching circuit coupled to the inductor and configured to charge a capacitance at a gate terminal of the transistor from a source via the inductor responsive to a first state of a control input, to block discharge of the charged capacitance responsive to a voltage at the gate terminal and to return charge from the charged capacitance to the source responsive to transition of the control input to a second state. The switching circuit may include a switch coupled in series with the inductor and the source and configured to conduct responsive to transition of the control input to the first state and a rectifier coupled in series with the inductor and the source and configured to block discharge of the charged capacitance responsive to the voltage at the gate terminal. The switch may include a field effect transistor and the rectifier may include a diode.

In some embodiments, the switching circuit further includes a second switch coupled in series with the inductor and the source and configured to conduct responsive to transition of the control input to the second state. The switching circuit may further include a resistor coupled between the second switch and a first terminal of the source and a second rectifier configured to block a current from a second terminal of the source to the first terminal of the source via the resistor.

In some embodiments, a voltage of the source is approximately equal to a Miller plateau voltage of the transistor. The switching circuit may be configured to generate a peak current through the inductor approximately concurrent with the voltage at the gate terminal of the transistor reaching a voltage of the source. The switching circuit may be configured to generate a peak voltage at the gate terminal of the transistor that exceeds a voltage of the source.

In further embodiments, a transistor driver includes an inductor coupled to a gate terminal of the transistor, a first switch a switch coupled in series with the inductor and a source and configured to conduct responsive to transition of a control input to a first state and a first rectifier coupled in series with the inductor and the source and configured to block discharge of the charged capacitance responsive to a voltage at the gate terminal. The driver further includes a second switch coupled in series with the inductor and the source and configured to conduct responsive to transition of the control input to a second state, a resistor coupled between the second switch and a first terminal of the source and a second rectifier configured to block a current from a second terminal of the source to the first terminal of the source via the resistor.

In still further embodiments, a transistor driver includes an inductor coupled to a gate terminal of the transistor and a switching circuit coupled to the inductor and configured to charge a capacitance at a gate terminal of the transistor from a source via the inductor responsive to a first state of a control input such that a peak charging current through the inductor approximately coincides with a voltage at the gate terminal of the transistor reaching a voltage of the source and to discharge the capacitance to the source responsive to a second state of the control input. The switching circuit may include a switch coupled in series with the inductor and the source and configured to conduct responsive to transition of the control input to the first state and a rectifier coupled in series with the inductor and the source and configured to block discharge of the charged capacitance responsive to the voltage at the gate terminal. The switch may include a first switch and the switching circuit may further include a second switch coupled in series with the inductor and the source and configured to conduct responsive to transition of the control input to the second state. The rectifier may include a first rectifier and the switching circuit may further include a resistor coupled between the second switch and a first terminal of the source and a second rectifier configured to block a current from a second terminal of the source to the first terminal of the source via the resistor.

DETAILED DESCRIPTION OF EXEMPLARY EMBODIMENTS

Figure 1:
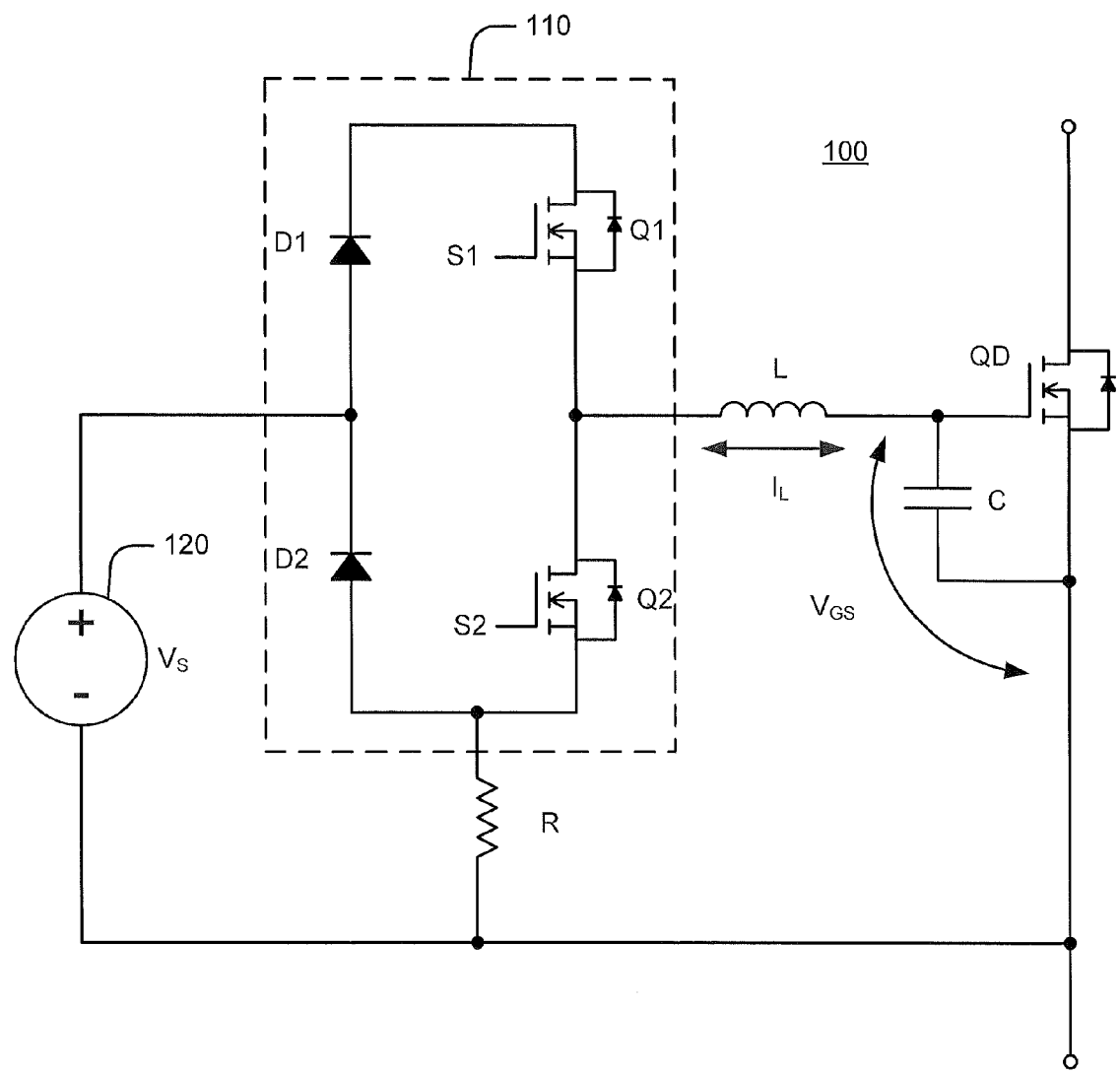
FIG. 1 is a schematic diagram illustrating a drive circuit according to some embodiments of the inventive subject matter.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

FIG. 1 illustrates a drive circuit 100 for driving a control terminal, i.e., a gate terminal, of a transistor QD. The drive circuit 100 includes an inductor L coupled to the gate terminal of the transistor QD and to a switching circuit 110 including first and second transistors Q1, Q2 and first and second diodes D1, D2. The switching circuit 110 is coupled to a source 120 that produces a voltage $V_S$. The switching circuit 110 is configured to charge a capacitance C at the gate terminal of the transistor QD from the source 120 via the inductor L responsive to a first state of a control input, e.g., responsive to assertion of a control signal S1, such that the transistor QD is turned on. The switching circuit 110 blocks discharge of the charged capacitance C responsive to a voltage $V_{GS}$ at the gate terminal and subsequently returns charge from the charged capacitance C to the source 120 responsive to transition of the control input to a second state, e.g., responsive to assertion of a second control signal S2, such that the transistor QD is turned off. In some embodiments, the capacitance C may be the intrinsic gate capacitance of the transistor QD alone or a combination of such intrinsic capacitance and capacitance provided by a discrete capacitor or other device.

Figure 2:
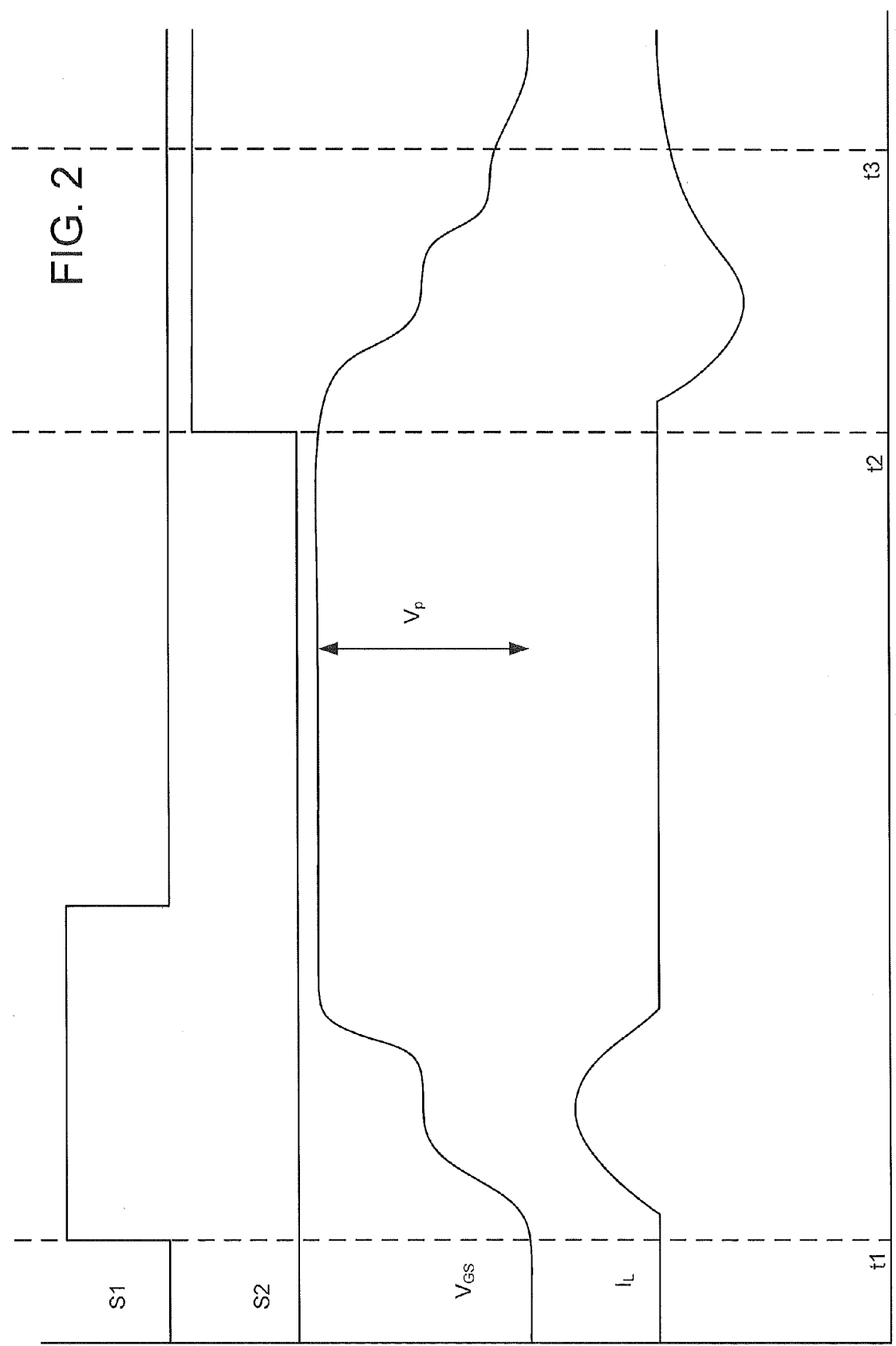
FIG. 2 is a graph illustrating operations of the drive circuit of FIG. 1.

Operations of the circuit 110 may be further understood by reference to FIG. 2 in conjunction with FIG. 1. Responsive to assertion of the first control signal S1 at time t1, the transistor Q1 turns on and current $I_L$ through the inductor L ramps up. When the gate-to-source voltage $V_{GS}$ reaches the Miller plateau voltage of the transistor QD, it flattens out until such time that sufficient charge has been transferred for the transistor QD to switch, after which the gate-to-source voltage $V_{GS}$ ramps up to a peak value $V_p$. When the inductor current $I_L$ resonates back down to zero, the first diode D1 blocks back conduction through the inductor L, thus maintaining the gate-to-source voltage $V_{GS}$ near the peak voltage Vp. The first control signal S1 may be deasserted any time after turn-on of the driven transistor QD, as the diode D1 blocks discharge of the capacitance C.

The driven transistor QD is turned off by assertion of the second control signal Q2. Upon assertion of the second control signal S2 at time t2, the capacitance C discharges, returning energy back to the source 120 via the second transistor Q2 and the second diode D2. On resistance of the second transistor Q2 and the forward voltage of the second diode D2 prevent complete discharge of the capacitance C to the source 120. When conduction of the second diode D2 begins to drop, current may continue to flow through a resistor R to further discharge the capacitance C and further reduce the gate-to-source voltage $V_{GS}$. The resistance of the resistor R may be sufficiently large to reduce dissipative loss, but small enough to sufficiently bleed off the charge on the capacitance C. For example, for a time T between assertion of the second control signal S2 and re-assertion of the first control signal S1, R may be chosen such that T>5RC to allow sufficient time for discharge of the capacitance C. It will be appreciated that other types of dissipative devices, such as transistors, may be used instead of or in combination with the resistor R.

If the source voltage Vs is approximately equal to the Miller plateau voltage of the transistor $Q_D$, the current IL through the inductor L may peak at approximately the point at which the gate-to-source voltage $V_{GS}$ reaches the source voltage Vs. The peak voltage Vp may be approximately twice the source voltage Vs. Accordingly, peak current may be advantageously supplied at the Miller plateau, facilitating rapid switching, and the gate-to-source voltage $V_{GS}$ may reach a value that stably maintains the transistor QD in an "on" state. In addition, a majority of the energy delivered to turn on the transistor QD may be recovered, minus losses in the circuit components, including the resistor R.

Figure 3:
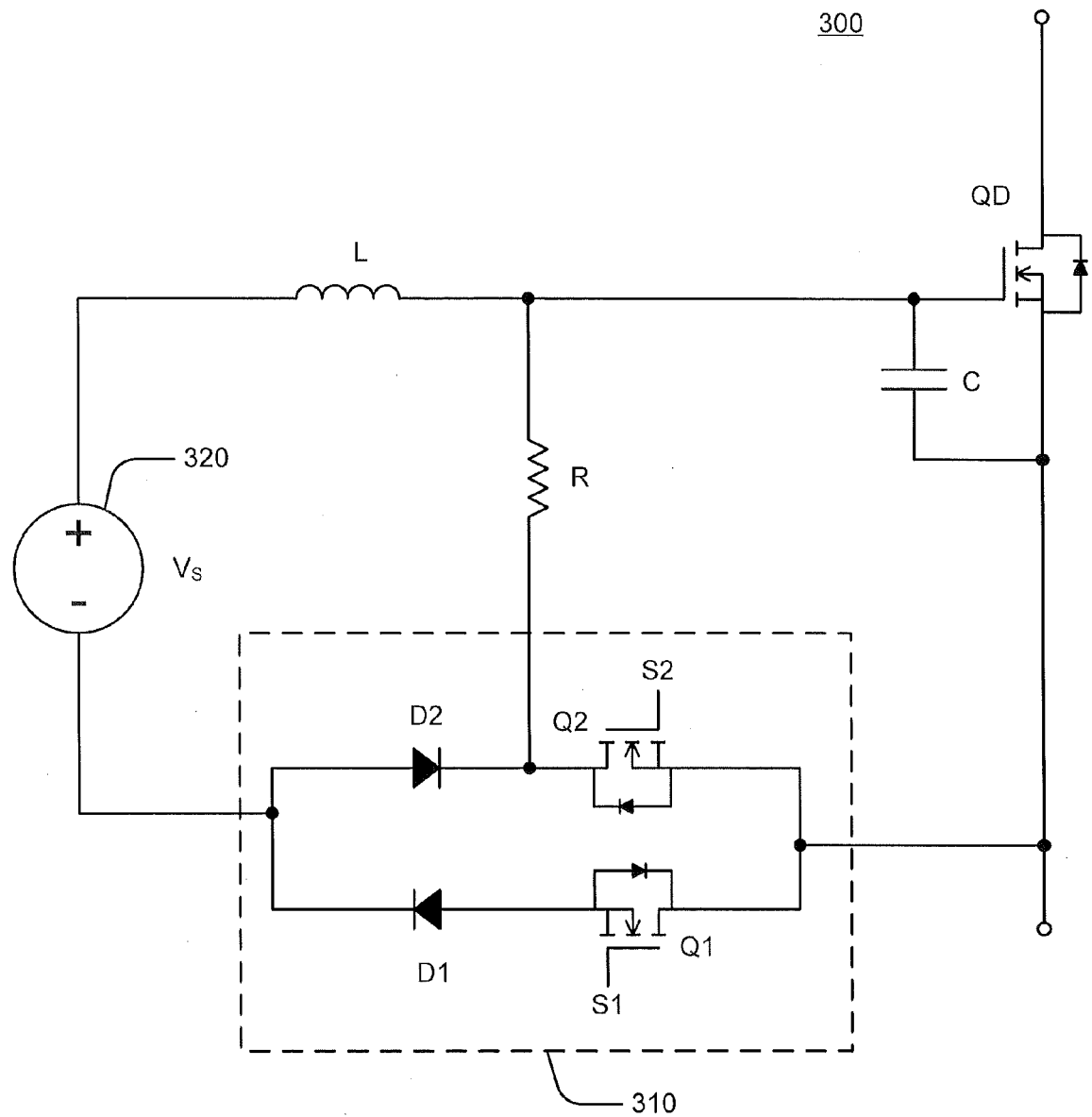
FIGS. 3-5 are schematic diagrams illustrating drive circuits according to further embodiments of the inventive subject matter.
Figure 4:
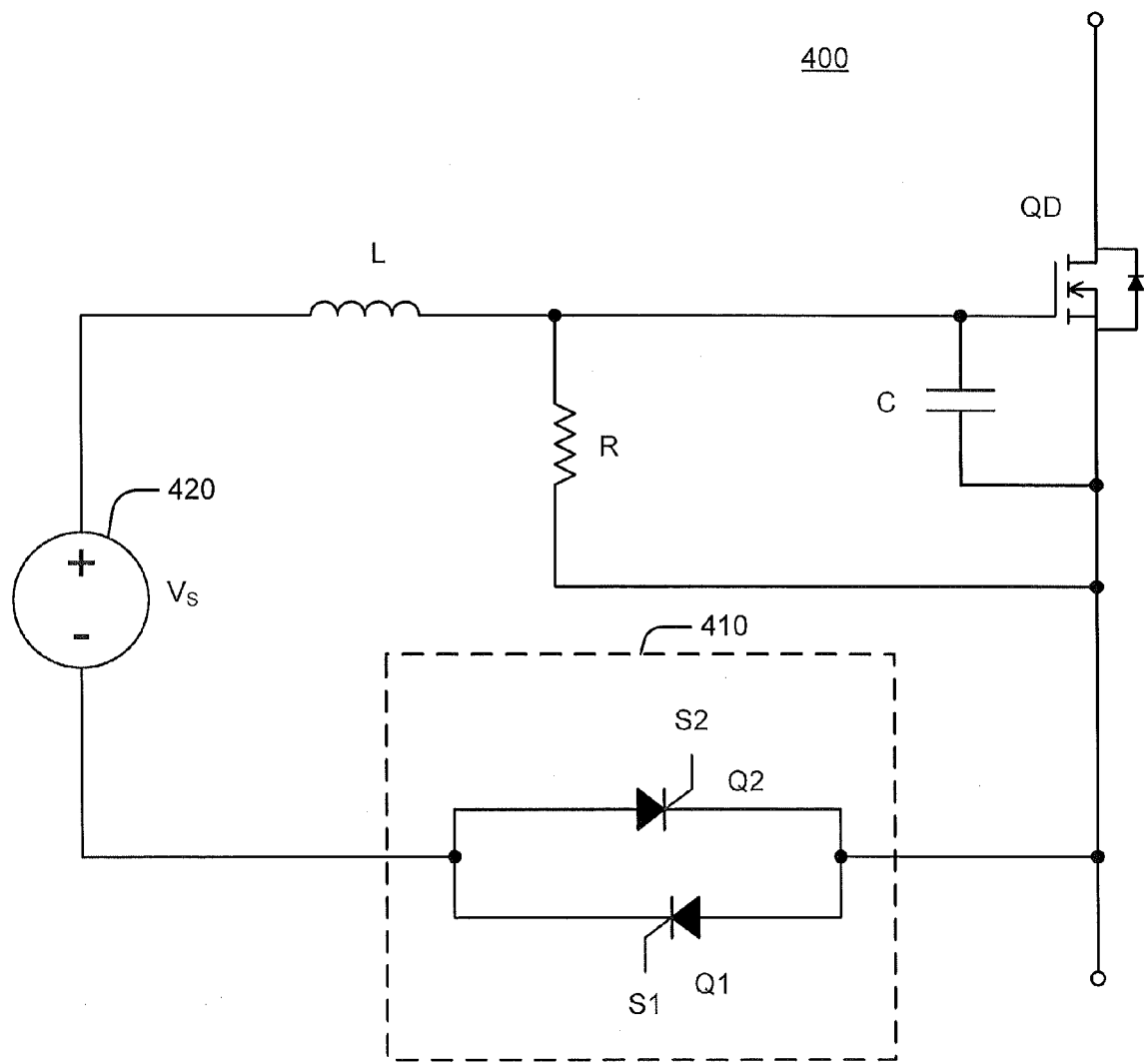
Figure 5:
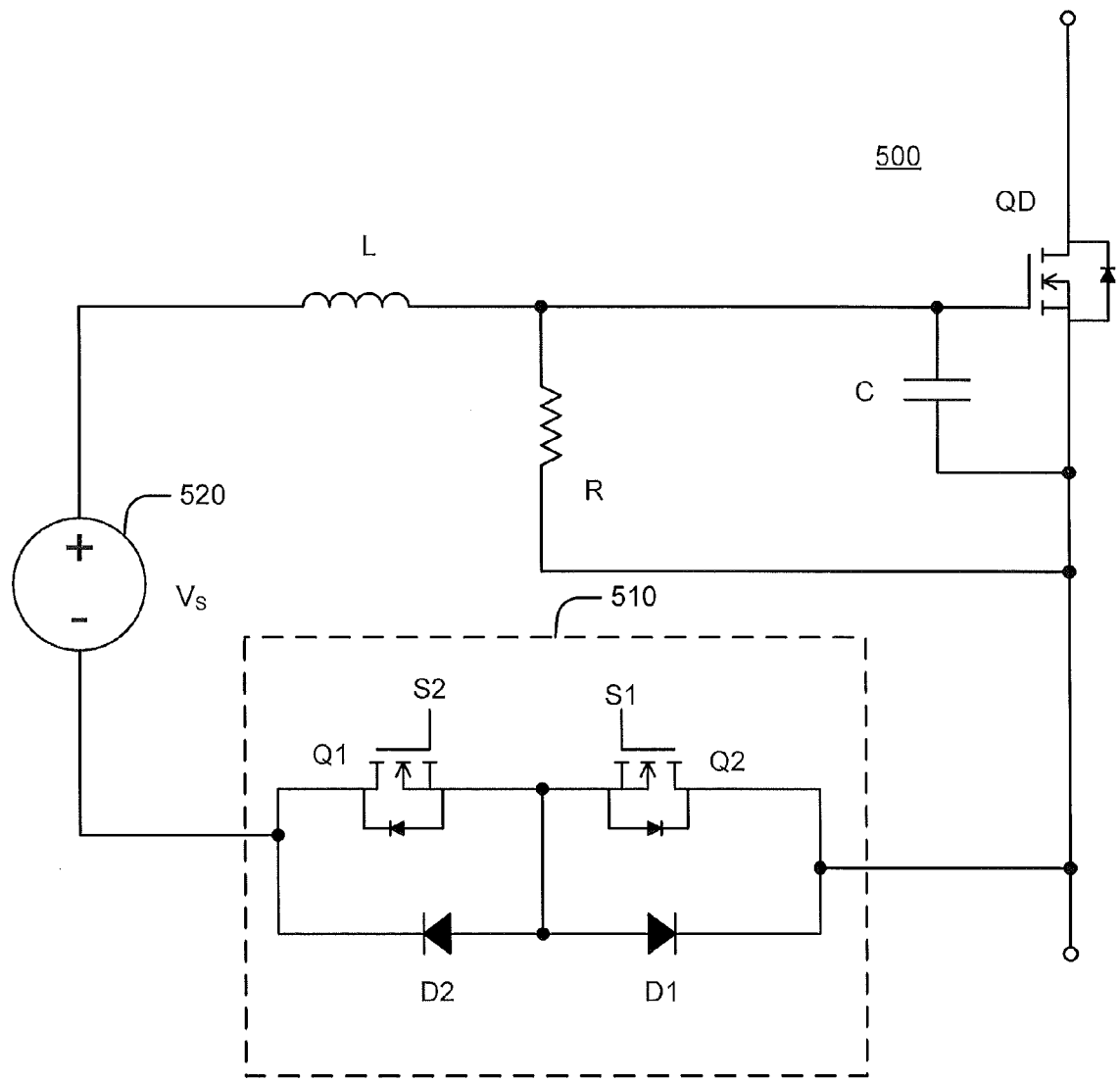

FIGS. 3-5 illustrate drive circuits according to further embodiments. Referring to FIG. 3, a drive circuit 300 includes a switching circuit 310 with an antiparallel arrangement of switches including, respectively, a series combination of a first transistor Q1 and a first diode D1 and a series combination of a second transistor Q2 and a second diode D2. This circuit may operate in a manner similar to that described above with reference to FIGS. 1 and 2. In particular, a first control signal S1 is asserted at a gate terminal of the first transistor Q1, charging a capacitance C at a gate terminal of a transistor QD from a source 320 via an inductor L and, thus, turning on the transistor QD. The capacitance C retains charge, keeping the transistor QD in an on state, until discharge is initiated responsive to assertion of a second control signal S2 at gate terminal of the second transistor Q2. Most of the energy used to charge the capacitance C may be returned to the source 320, and a resistor R may dissipate remaining charge after the second diode D2 ceases conducting.

Referring to FIG. 4, a drive circuit 400 includes a switching circuit 410 comprising antiparallel connected silicon controlled rectifiers (SCRs) Q1, Q2. A capacitance C at the gate terminal of a transistor QD is charged by turning on the first SCR Q1 responsive to a control signal S1, and is discharged by turning on the second SCR Q2 responsive to a second control signal S2. Most of the energy used to charge the capacitance C may be returned to the source 420, and a resistor R may dissipate remaining charge after the second SCR Q2 ceases conducting.

FIG. 5 illustrates another driver circuit 500 according to further embodiments of the inventive subject matter. The driver circuit 500 includes a switching circuit 510 including first and second transistors Q1, Q2 and first and second diodes D1, D2 (the diodes D1, D2 may be separate diodes or body diodes associated with the respective transistors Q1, Q2). Responsive to assertion of a first control signal S1, the first transistor Q1 turns on, causing a capacitance C at the gate terminal of a transistor QD to charge via an inductor L, eventually turning on the transistor QD. The charge on the capacitance C is maintained until a second control signal S2 is asserted, turning on the second transistor Q2. Most of the energy used to charge the capacitance C may be returned to the source 520, and a resistor R may dissipate remaining charge after the second diode D2 ceases conducting.

In the drawings and specification, there have been disclosed exemplary embodiments of the inventive subject matter. Although specific terms are employed, they are used in a generic and descriptive sense only and not for purposes of That which is claimed:

1. A transistor driver comprising:
   an inductor coupled to a gate terminal of a transistor; and
   a switching circuit coupled to the inductor and configured to charge a capacitance at a gate terminal of the transistor from a source via the inductor responsive to a first control signal, to block discharge of the charged capacitance responsive to a voltage at the gate terminal and to return charge from the charged capacitance to the source responsive to a second control signal, wherein the switching circuit is configured to generate a peak current through the inductor approximately concurrent with the voltage at the gate terminal of the transistor reaching a voltage of the source.

2. The transistor driver of claim 1, wherein the switching circuit comprises:
   a switch coupled in series with the inductor and the source and configured to conduct responsive to the first control signal; and
   a rectifier coupled in series with the inductor and the source and configured to block discharge of the charged capacitance responsive to the voltage at the gate terminal.

3. The transistor driver of claim 2, wherein the switch comprises a field effect transistor and wherein the rectifier comprises a diode.

4. The transistor driver of claim 2, wherein the switch comprises a first switch and wherein the switching circuit further comprises:
   a second switch coupled in series with the inductor and the source and configured to conduct responsive to the second control signal.

5. The transistor driver of claim 4, wherein the rectifier comprises a first rectifier and wherein the switching circuit further comprises:
   a resistor coupled between the second switch and a first terminal of the source; and
   a second rectifier configured to block a current from a second terminal of the source to the first terminal of the source via the resistor.

6. The transistor driver of claim 2, wherein the switch and the rectifier are provided by a silicon controlled rectifier.

7. The transistor driver of claim 1, wherein a voltage of the source is approximately equal to a Miller plateau voltage of the transistor.

8. The transistor of claim 1, wherein the switching circuit is configured to generate a peak voltage at the gate terminal of the transistor that exceeds a voltage of the source.

9. A transistor driver comprising:
   an inductor coupled to a gate terminal of the transistor;
   a first switch coupled in series with the inductor and a source and configured to conduct responsive to a first control signal;
   a first rectifier coupled in series with the inductor and the source and configured to block discharge of the charged capacitance responsive to a voltage at the gate terminal;
   a second switch coupled in series with the inductor and the source and configured to conduct responsive to a second control signal;
   a resistor coupled between the second switch and a first terminal of the source; and
   a second rectifier configured to block a current from a second terminal of the source to the first terminal of the source via the resistor.

10. The transistor driver of claim 9, wherein the first and second switches comprise respective first and second field effect transistors and wherein the rectifier comprises a diode.

11. The transistor driver of claim 9, wherein the first switch and the rectifier are provided by a first silicon controlled rectifier and wherein the second switch is provided by a second silicon controlled rectifier.

12. The transistor driver of claim 9, wherein a voltage of the source is approximately equal to a Miller plateau voltage of the transistor.

13. The transistor driver of claim 9, configured to generate a peak current through the inductor approximately concurrent with the voltage at the gate terminal of the transistor reaching a voltage of the source.

14. The transistor driver of claim 13, configured to generate a peak voltage at the gate terminal of the transistor that exceeds a voltage of the source.

15. A transistor driver comprising:
   an inductor coupled to a gate terminal of the transistor; and
   a switching circuit coupled to the inductor and configured to charge a capacitance at a gate terminal of the transistor from a source via the inductor responsive to a first control signal such that a peak charging current through the inductor approximately coincides with a voltage at the gate terminal of the transistor reaching a voltage of the source and to discharge the capacitance to the source responsive to a second control signal.

16. The transistor driver of claim 15, wherein the switching circuit comprises:
   a switch coupled in series with the inductor and the source and configured to conduct responsive to the first control signal; and
   a rectifier coupled in series with the inductor and the source and configured to block discharge of the charged capacitance responsive to the voltage at the gate terminal.

17. The transistor driver of claim 16, wherein the switch comprises a first switch and wherein the switching circuit further comprises:
   a second switch coupled in series with the inductor and the source and configured to conduct responsive to the second control signal.

18. The transistor driver of claim 16, wherein the rectifier comprises a first rectifier and wherein the switching circuit further comprises:
   a resistor coupled between the second switch and a first terminal of the source; and
   a second rectifier configured to block a current from a second terminal of the source to the first terminal of the source via the resistor.

19. The transistor driver of claim 15, wherein a voltage of the source is approximately equal to a Miller plateau voltage of the transistor.

* * * * *